United States Patent [19]

Moore et al.

[11] Patent Number: 4,884,855

[45] Date of Patent: Dec. 5, 1989

[54] NARROW-BAND OPTICAL ABSORPTION FILTER

[75] Inventors: James E. Moore, Wheaton, Ill.; B. Michael Kale, Ridgefield, Conn.; George Csanak, Los Alamos, N. Mex.; Fritz Luty, Salt Lake City, Utah

[73] Assignee: Barnes Engineering Company, Stamford, Conn.

[21] Appl. No.: 512,998

[22] Filed: Jul. 12, 1983
(Under 37 CFR 1.47)

[51] Int. Cl.$^4$ .............................................. G02B 5/22
[52] U.S. Cl. .................................... 350/1.1; 350/311; 252/584; 252/587
[58] Field of Search ................ 350/1.1, 311; 252/584, 252/587

[56] References Cited

U.S. PATENT DOCUMENTS

| | | |
|---|---|---|
| 3,312,759 | 4/1967 | Letter . |
| 3,887,485 | 6/1975 | Neurath . |
| 3,914,516 | 10/1975 | Ritter . |
| 4,038,201 | 7/1977 | Hargreaves .......................... 252/584 |
| 4,101,331 | 7/1978 | Anderson . |
| 4,177,321 | 12/1979 | Nishizawa . |
| 4,317,751 | 3/1982 | Kraushaar et al. .................. 252/584 |
| 4,726,655 | 2/1988 | Mahlein .............................. 350/1.1 |

FOREIGN PATENT DOCUMENTS 1954802  3/1971  Fed. Rep. of Germany .

OTHER PUBLICATIONS

"Solid Solution Halide Crystals" by O'Connor et al., Mat. Res. Bull., vol. 7, #12, pp. 1423-1430, 1972.
"Infrared Absorption Spectra of Bifluorides in Alkali Halide Disks", J. A. A. Ketelaar, C. Haas and J. Van Der Elsken, Letters to the Editor, pp. 624-625.
"Iodides Only", p. 389, E. M. Chernotordik, Zh. Obshch, Khim., 4 [4] 459, (1934).
"Halides Only", p. 388, F. E. E. Germann and C. F. Metz, J. Phys. Chem., 35, 1949, (1931).
"Precipitation in NaCl-KCl Mixed Crystals", R. G. Wolfson, W. Kobes, and M. E. Fine, Journal of Applied Physics, vol. 37, No. 2, Feb. 1966, pp. 704-712.
"Infra-Red Spectra of Crystals", W. Vedder and D. F. Hornig, pp. 189-262.
"Infra-Red Absorption Spectrum of the Nitrite Ion in Alkali Halide Solid Solutions", Spectrochimica Acta, 1959, vol. 13, pp. 336-337.
"Frequency Shifts in the Infrared Absorption Spectrum of Complex Ions in Solid Solution", J. A. A. Ketelaar and J. Van Der Elsken, Letters to the Editor, pp. 336-337.
"Theoretical Study of Protection of Optical Systems from Pulsed-Laser Irradiation", Marshall S. Spark., AFWAL-TR-80-4178, pp. 104-160.
"The Infra Red Absorption Spectrum of the Bifluoride Ion in Solid Solutions", J. Van Der Elsken, (Centrale Bibliotheek).
"Thin Films for Use on Sodium Chloride Components of Carbon Dioxide Lasers", P. A. Young, Thin Solid Films, 6, (1970), pp. 423-441.
"$CO_2$ Laser Saturation of Internal-Vibrational Modes of Molecular Impurities in Alkali Halides", A. R. Chraplyvy and A. J. Sievers, Optics Letters, vol. 3, No. 3, Sep. 1978.
"Infrared Spectrum of Matrix-Isolated Cyanate Ion. I. Vibrational Analysis, Bandwidths, and Absolute Intensities in Potassium Halides", V. Schettino and J. C. Hisatsune, The Journal of Chemical Physics, vol. 52, No. 1, Jan. 1, 1970, pp. 9-27.

(List continued on next page.)

Primary Examiner—Bruce Y. Arnold
Assistant Examiner—J. P. Ryan
Attorney, Agent, or Firm—Brumbaugh, Graves, Donohue & Raymond

[57] ABSTRACT

A narrow-band filter for absorbing radiation at a wavelength in the range of 9.2 to 10.8 microns and for transmitting radiation in a surrounding 8 to 12 micron band having a high transmission ratio. The filter is comprised of a pure or mixed alkali-halide crystal having optical incidence and transmission surfaces and thiocyanate or borofluoride as an impurity.

45 Claims, 1 Drawing Sheet

OTHER PUBLICATIONS

"Vibrational Spectrum of Cyanate Ion in Various Alkali Lattices", A. Maki and J. C. Decius, The Journal of Chemical Physics, vol. 31, No. 3, Sep. 1959, pp. 772–782.

"Photon and Phonon Interactions with OH$^-$ and OD$^-$ in KCl", Cheuk K. Chau, Miles V. Klein and Brent Wedding, Physical Review Letters, vol. 17, No. 10, Sep. 5, 1966, pp. 521–525.

"The Vibrational Spectra of Sulfate Ions in Alkali Halide Crystals", J. C. Decius, E. H. Coiker and G. L. Brenna, Spectrochimica Acta, vol. 19, pp. 1231–1239.

"Cyanate Ion in Alkali Halides: New Vibrational Levels and Interpretation of Localized Lattice Modes", J. C. Decius, J. L. Jacobson, W. F. Sherman and G. R. Wilkinson, The Journal of Chemical Physics, vol. 43, No. 1, Oct. 1, 1963, pp. 2180–2186.

"Infrared Absorption by $CO_3^{2-}$ $M^{2+}$ Complexes in KCl and KBr Lattices", V. P. Den'yanenko, Yu. P. Tsyashchenko, and E. M. Verlan, Soviet Physics–Solid State, vol. 13, No. 3, Sep. 1971, pp. 767–769.

"Vibration Frequencies of $NO_2^-$ and $NO_3^-$ Ions in KBr Crystals", R. Kato and J. Rolfe, The Journal of Chemical Physics, vol. 47, No. 6, Sep. 15, 1967, pp. 1901–1910.

"The Infra-Red Spectrum of the Iodae Ion in the Potassium Iodide Lattice", W. E. Klee, Spectrochimica Acta, vol. 26A, pp. 1165–1169.

"Raman and Vibronic Spectra of the Nitrite Ion in Alkali Halides", A. S. R. Evans and D. B. Fitchen, Physical Review B, vol. 2, No. 4, pp. 1074–1091.

"Temperature Dependence of the High-Frequency Band Width of Crystal and Local Vibrations", A. A. Klochikhin, T. I. Maksimova, and A. I. Stekhnov, Soviet Physics–Solid State, vol. 10, No. 11, May 1969, pp. 2617–2624.

"Temperature Dependence of the Infrared Absorption Spectrum of NCO Impurity Ions in KBr and KCl Crystals", I. I. Kondilenko, Yu. P. Tsyashchenko, and V. A. Pasechnyi, Soviet Physics–Solid State, vol. 12, No. 12, Jun. 1971, pp. 2990–2991.

"Lattice Vibrations of Solid Solutions; Infrared Absorption Spectra of Nitrate Ions in Alkali Halides", R. Metselaar and J. Van Der Elsken, Physical Review, vol. 163, No. 2, Jan. 1968, pp. 359–375.

"Formation of Divalent Anion and Cation Impurity Complexes in KCl Crystals", D. N. Mirlin and I. I. Reshina, Soviet Physics–Solid State, vol. 10, No. 4, Oct. 1968, pp. 895–900.

"Infrared Spectra of Dilute Solid Solutions", H. W. Morgan and P. A. Staats, Journal of Applied Physics, Supplement to vol. 33, No. 1, Jan., 1962, pp. 364–366.

"Rational Degrees of Freedom of Molecules in Solids I. The Cyanide Ion in Alkali Halides", W. D. Seward and V. Narayanamurti, Physical Review, vol. 148, No. 1, Aug. 5, 1966, pp. 463–481.

"Distribution of Hydroxide Ions in Doped Alkali Halide Crystals", Thomas G. Stoebe, J. Phys. Chem. Solids, vol. 31, pp. 1291–1294.

"Infrared Absorption Spectra of Solid Solutions: Cluster Formation of Nitrate Ions in Alkali Halides", J. Van Der Elsken and S. G. Kroon, The Journal of Chemical Physics, vol. 41, No. 11, Dec. 1, 1964, pp. 3451–3452.

"The Vibrational Spectra of Molecules and Complex Ions in Crystals, III. Ammonium Chloride and Deutero-Ammonium Chloride", The Journal of Chemical Physics, vol. 18, No. 3, Mar. 1950, pp. 296–304.

"Infrared Absorption of the Hydroxyl Ion in Alkali Halide Crystals", Brent Weding and Miles V. Klein, Physical Review, vol. 177, No. 3.

"Matrix Infrared Spectra and Anharmonic Force Field of NCO-", D. Foss Smith, Jr. and John Overend, The Journal of Chemical Physics, vol. 58, No. 4, Feb. 15, 1973, pp. 1636–1646.

"Infrared Spectra of Isotopic Bicarbonate Monomer Ions", D. L. Bernitt, K. O. Hartman and I. C. Hisatsune, The Journal of Chemical Physics, vol. 42, No. 10, May 15, 1965, pp. 3353–3357.

"Impurity-Induced Infrared Absorption in Alkali Halide $CO_2$ Laser Windows", F. W. Patten, R. M. Garvey and M. Hass, Mat. Res. Bull., vol. 6, pp. 1321–1324.

"A New Saturable Absorber for the $CO_2$ Laser Using Doped KCl", R. K. Ahrenkiel, J. F. Figueira, C. R. Phipps, Jr., D. J. Dunlavy, S. J. Thomas and A. J. Sievers, Appl. Phys. Lett., 33(8), Oct. 15, 1978, pp. 705–707, 87–84.

"Absorbing Light Filters for the Visible and Infrared Regions of the Spectrum Based on Alkali Halide Crystals Colored by X Centers", V. V. Udod, Optics & Spectroscopy, vol. 27, No. 4, Oct. 1969, pp. 379–380.

NARROW-BAND OPTICAL ABSORPTION FILTER

BACKGROUND OF THE INVENTION

This application is related to co-pending application Ser. No. 252,449 filed Apr. 9, 1981 which discloses narrow-band filters which absorb radiation at a selected frequency and transmit optical radiation at other frequencies within a selected frequency band.

Co-pending application, Ser. No. 252,449, describes a narrow-band filter for absorbing radiation from a carbon-dioxide laser with a wavelength of 10.59 microns comprising an alkali-halide crystal having optical incidence and transmission surfaces and having an impurity of approximately 1 atomic percent perrhenate ion or chromate ion. It was suggested that suitable alkali-halides included mixtures of sodium bromide, potassium bromide and lithium bromide.

It is an object of the present invention to provide a narrow-band absorption filter for carbon dioxide radiation in the 9.2–10.8 micron region.

It is further an object of the present invention to provide a narrow-band absorption filter for carbon dioxide laser radiation at 10.59 microns It is further an object of the present invention to provide a narrow-band absorption filter for carbon dioxide laser radiation at 9.28 microns.

SUMMARY OF THE INVENTION

In accordance with the invention, there is provided a composition of matter comprised of an alkali-halide crystal which has an impurity of from approximately 0.01 to 5 atomic percent of thiocyanate or borofluoride ion.

In particular examples of the composition the alkali-halide is rubidium iodide or cesium iodide or potassium iodide. In one example, the composition of matter has about 99 atomic percent of the alkali-halide and about 1 atomic percent of thiocyanate ion.

In another example, the composition of matter has about 99.5 atomic percent of the alkali-halide and about 0.5 atomic percent of borofluoride ion.

In another example, the composition of matter has about 98 atomic percent of the alkali-halide and about 2 atomic percent of thiocyanate. The alkali-halide is rubidium iodide or cesium iodide or potassium iodide. Rubidium iodide is a preferred alkali-halide.

In accordance with the invention, there is also provided a composition of matter comprising a mixed crystal with thiocyanate or a borofluoride ion impurity. The mixed crystal is comprised of rubidium iodide or cesium iodide or potassium iodide and another alkali-halide. In one example the mixed crystal is about 85 to 99 atomic percent rubidium iodide, about 1 to 15 atomic percent of another alkali-halide and about 0.1 to 5 atomic percent thiocyanate ion impurity.

In another example the mixed crystal is about 85 to 99 atomic percent cesium iodide, about 1 to 15 atomic percent of another alkali-halide and about 0.1 to 5 atomic percent thiocyanate as impurity.

In a further example the mixed crystal is about 85 to 99 atomic percent potassium iodide, about 1 to 15 atomic percent of another alkali-halide and about 0.1 to 5 atomic percent thiocyanate.

The other alkali-halide is selected from a group consisting of rubidium iodide, potassium iodide and rubidium bromide.

In accordance with the invention there is provided a narrow-band filter which absorbs radiation at a wavelength in the 9.2–10.8 micron region and transmits radiation in a surrounding 8–12 micron band. The filter comprises a pure alkali-halide crystal or a mixed crystal of alkali-halides with optical incidence and transmission surfaces and has a thiocyanate ion or borofluoride ion impurity. The preferred range of the impurity is 0.01 to 5 atomic percent.

In a particular example there is provided a narrow-band filter which absorbs radiation at a wave length of 10.59 microns and transmits radiation in a surrounding 8 to 12 micron band.

In a further example, there is provided a narrow-band filter which absorbs radiation at a wavelength of 10.55 microns and transmits radiation in a surrounding 8 to 12 micron band.

In another example there is provided narrow-band filter which absorbs radiation at a wavelength of 10.68 microns and transmits radiation in a surrounding 8 to 12 micron band.

In another example there is provided narrow-band filter which absorbs radiation at a wavelength of 9.28 microns and transmits radiation in a surrounding 8 to 12 micron band.

In particular examples of the narrow-band filter, the alkali-halide crystal comprises rubidium iodide or cesium iodide or potassium iodide.

In a particular example of the present invention, the narrow-band filter is comprised of about 99 atomic percent of rubidium iodide and about 1 atomic percent of thiocyanate ion. In a further example, the narrow-band filter is comprised of about 98 atomic percent of rubidium iodide and about 2 atomic percent of thiocyanate.

In another example, the narrow-band filter is comprised of about 99 atomic percent of potassium iodide and about 1 atomic percent of thiocyanate ion. In a further example, the narrow-band filter is comprised of 99 atomic percent of cesium iodide and about 1 atomic percent of thiocyanate ion.

In another example the narrow-band filter is comprised of about 99.5 atomic percent of potassium iodide and about 0.5 atomic percent of borofluoride ion.

In other particular examples of the narrow-band filter the crystal is a mixed crystal comprised of rubidium iodide or cesium iodide or potassium iodide and another alkali-halide with thiocyanate or borofluoride ion as an impurity in the mixed crystal.

In particular examples of the present invention, the narrow-band filter is comprised of from about 85 to 99 atomic percent rubidium iodide or cesium iodide or potassium iodide, from about 1 to 15 atomic percent of another alkali-halide, such as cesium iodide, potassium iodide, rubidium iodide and rubidium bromide, and from about 0.1 to 5 atomic percent of thiocyanate ion.

For a better understanding of the present invention, together with other and further objects, reference is made to the following description, taken in conjunction with the accompanying drawings and its scope will be pointed out in the appended claims.

DESCRIPTION OF THE INVENTION

Figure 1:
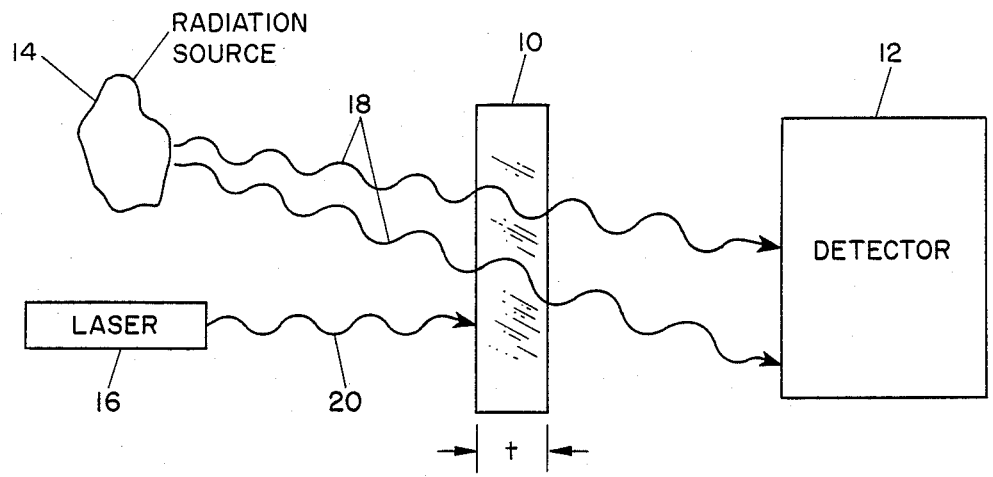
FIG. 1 is a drawing showing a system which uses a filter in accordance with the present invention.

FIG. 1 shows an optical system, for example an infrared detection system, using a filter 10 in accordance with the present invention. The system of FIG. 1 includes a detecting device 12, such as an infrared camera, to be used for detecting infrared or other optical frequency radiation emanating from a radiation source 14. Also shown in FIG. 1 is a laser 16 which emits a laser beam 20, which may seriously interfere with the detection of radiation from source 14 by detector 12. The filter 10 of FIG. 1 has optical incidence and transmission surfaces and is designed to pass most of the relatively broad-band radiation from radiation source 14, indicated by waves 18, and to absorb the single frequency radiation from laser 16. Thus, by use of filter 10, it is possible to specifically filter out interfering laser radiation while detecting radiation in the same frequency band emanating from source 14.

Figure 2:
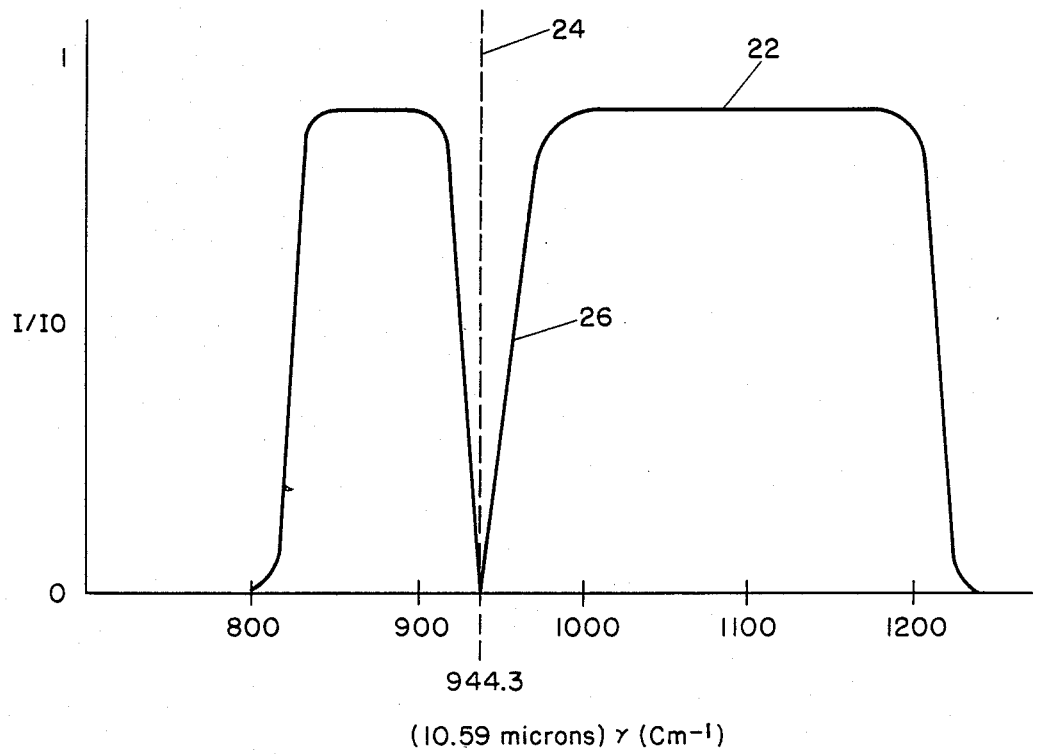
FIG. 2 is a graph showing the spectral transmission characteristics of the filter of FIG. 1.

In order to achieve the objects of the filter 10 shown in FIG. 1, it is necessary that the filter have a transmission characteristic which is shown by the graph of FIG. 2. The radiation detector 12 is adapted to receive, for example, infrared radiation having wave numbers from approximately 800 to 1300 $cm^{-1}$. It is therefore desired to have a relatively flat and high transmission ratio over that frequency band as indicated by the flat top portion 22 of the transmission curve plotted in FIG. 2. In order to filter out narrow-band radiation from laser 16, which is assumed to have an emission frequency indicated by line 24 in FIG. 2, the curve of relative filter transmission $I/I_o$ has a deep and narrow-band notch 26. Thus, a large proportion of the desired wide-band radiation from source 14 will pass through filter 10 and be received by detector 12, while single-frequency or narrow-band radiation from laser 16 will be largely absorbed by filter 10 and will not interfere with the operation of detector 12.

Certain materials, particularly multi-atom ions such as thiocyanate, cyanate, perrhenate, cyanide, nitrite, carbonate, bicarbonate, azide, hydrogen difluoride ($HF_2$), hydroxide, ammoniate, boron hydride, borofluoride, chromate and borate, among others, are known to have narrow-band spectral absorption characteristics at discrete frequencies, including frequencies of interest in the infrared spectrum. These frequencies are very often measured in a matrix isolation measurement, wherein spectral characteristics of an impurity material, such as an ion, are measured by placing small quantities, for example 0.1 atomic percent of the material, in a crystal of another material. As used herein the term atomic percent refers to the percent of a particular substance in a crystal as compared to the number of ions of similar substances. Thus atomic percent of an alkali-halide salt refers to the ratio of the number of molecules of that salt to total molecules in the crystal. Atomic percent of an ion refers to the ratio of the number of ions of a particular type, e.g. anions or cations, to similar ions in a crystal.

Co-pending application Ser. No. 252,449 describes use of matrix isolation properties of crystal impurities for the purpose of providing a narrow-band filter for filtering out undesired interfering radiation from a broad-band radiation received by a detector.

The present inventors have discovered other, improved narrow-band filters with particular usefulness for absorbing radiation with wavelengths in the 9.2 to 10.8 micron region corresponding to radiation from a $CO_2$ laser, and passing radiation in a surrounding frequency band.

It has been discovered that thiocyanate ion ($CNS^-$) in rubidium iodide crystal provides an effective narrow-band filter at 10.59 microns. It has also been discovered that thiocyanate in cesium iodide crystal provides an effective narrow-band filter at 10.68 microns and in potassium iodide crystal at 10.55 microns.

It has also been discovered that the borofluoride ion in potassium iodide crystal provides an effective narrowband filter at 9.28 microns.

It has also been discovered by the inventors that when thiocyanate ion or borofluoride ion is used as impurity in a mixed crystal of rubidium iodide or cesium iodide or potassium iodide and another alkali-halide such as rubidium iodide, cesium iodide, potassium iodide and rubidium bromide, considerable broadening of the band is produced compared to pure alkali-halide along with a shifting of the absorption line.

EXAMPLE I

A crystal of 99 percent rubidium iodide and 1 atomic percent thiocyanate ion in the form of potassium thiocyanate was prepared. The crystal was grown by the Czochralski technique. The crystal was found to have an optical density of about 3.0 per cm at a wave number of 944.3 $cm^{-1}$ corresponding to the P(20) emission frequency of a carbon dioxide laser. The crystal was found to have an optical transmission ratio of approximately 91% over a frequency range of 800 to 1200 $cm^{-1}$. The crystal was subjected to laser radiation emanating from ADKIN model MIR2-50-SL carbon dioxide laser. The beam diameter was 1.5 cm and the total power on the P(20) line was 1.375 watt. The narrow-band absorption characteristics of the filter was verified.

EXAMPLE II

A crystal of 99 percent potassium iodide and 1 atomic percent thiocyanate ion in the form of potassium thiocyanate was prepared. The crystal was grown by the Czochralski technique. The crystal was found to have an optical density of about 1.1 per cm at a wave number of 947.7 $cm^{-1}$ corresponding to the P(16) emission frequency of a carbon dioxide laser. The crystal was found to have an optical transmission ratio of approximately 90 percent over a frequency range of 800 to 1200 $cm^{-1}$.

EXAMPLE III

A crystal of 98 percent rubidium iodide and 2 atomic percent thiocyanate ion in the form of potassium thiocyanate was prepared. The crystal was grown by the Czochralski technique. The crystal was found to have an optical density of about 2.0 per cm at a wave number of 944.3 $cm^{-1}$ corresponding to the P(20) emission frequency of a carbon dioxide laser. The crystal was subjected to carbon dioxide laser radiation and the narrow-band absorption properties were confirmed.

EXAMPLE IV

It is recognized that crystals other than pure rubidium iodide may provide an effective filter for 10.59 micron radiation. A mixture of 60 percent rubidium iodide and 40 percent cesium iodide was melted and a crystal was formed by the Czochralski technique consisting of 89 atomic percent of rubidium iodide, 9 atomic percent of cesium iodide and 2 atomic percent of thiocyanate ion in the form of potassium thiocyanate. Measurements of the optical characteristics of the crystal were made. The crystal was found to have an optical density of 6.4 per cm at a wave number of 944.3 cm$^{-1}$ corresponding to the P(20) emission frequency of a carbon dioxide laser. The crystal was found to have an optical transmission ratio of approximately 85% over a frequency range of 800 to 1200 cm$^{-1}$. The mixed crystal showed considerable broadening of the absorption band compared to pure rubidium iodide because of the addition of cesium iodide. Due to this broadening the shift of the absorption band due to addition of cesium iodide is barely detectable.

EXAMPLE V

A crystal of 99.5 percent potassium iodide and 0.5 atomic percent of borofluoride ion in the form of potassium borofluoride was prepared. The crystal was grown by the Czochralski technique. The crystal was found to have an optical density of about 180 per cm at a wave number of 1077.6 cm$^{-1}$ corresponding to the 9.28 microns $CO_2$ laser emission line. The crystal was subjected to carbon dioxide laser radiation and the narrow-band absorption properties were confirmed.

Those skilled in the art will recognize the transmission of the crystals mentioned above can be improved by coating the crystals with appropriate materials.

While there have been described what are believed to be the preferred embodiments of the present invention, those skilled in the art will recognize that other and further modifications may be made thereto without departing from the spirit of the invention, and it is intended to claim all such changes as fall within the true scope of the invention.

We claim:

1. A composition of matter comprising an alkali-halide crystal having an impurity from about 0.01 to 5 atomic percent thiocyanate ion.

2. The composition of matter as specified in claim 1 wherein said impurity comprises about 1 atomic percent of thiocyanate ion.

3. A composition of matter comprising rubidium iodide crystal having an impurity from about 0.01 to 5 atomic percent thiocyanate.

4. A composition of matter as specified in claim 3 wherein said impurity comprises about 2 atomic percent of thiocyanate.

5. A composition of matter comprising potassium iodide crystal having an impurity from about 0.01 to 5 atomic percent thiocyanate.

6. A composition of matter comprising cesium iodide crystal having an impurity from about 0.01 to 5 atomic percent thiocyanate.

7. A composition of matter comprising a mixed crystal having a selected impurity, wherein said impurity is thiocyanate ion and the crystal comprises rubidium iodide and another alkali-halide.

8. The composition of matter as specified in claim 7 wherein said crystal comprises from about 85 to 99 atomic percent rubidium iodide, from about 1 to 15 atomic percent of said other alkali-halide and from about 0.01 to 5 atomic percent of thiocyanate ion.

9. The composition of matter as specified in claim 7 wherein said crystal comprises about 89 atomic percent rubidium iodide, about 9 atomic percent of said other alkali-halide and about 2 atomic percent of thiocyanate ion.

10. The composition of matter as specified in claim 7 wherein said other alkali-halide is selected from the group consisting of cesium iodide, potassium iodide and rubidium bromide.

11. A composition of matter comprising a mixed crystal having a selected impurity, wherein said impurity is thiocyanate ion and the crystal comprises potassium iodide and another alkali-halide.

12. The composition of matter as specified in claim 11 wherein said crystal comprises from about 85 to 99 atomic percent of potassium iodide, from about 1 to 15 percent of said other alkali-halide and from about 0.01 to 5 atomic percent of thiocyanate ion.

13. The composition of matter as specified in claim 11 wherein said crystal comprises about 89 atomic percent potassium iodide, about 9 atomic percent of said other alkali-halide and about 2 atomic percent of thiocyanate ion.

14. The composition of matter as specified in claim 11 wherein said other alkali-halide is selected from the group consisting of cesium iodide, rubidium iodide and rubidium bromide.

15. A composition of matter comprising a mixed crystal having a selected impurity, wherein said impurity is thiocyanate ion and the crystal comprises cesium iodide and another alkali-halide.

16. The composition of matter as specified in claim 15 wherein said crystal comprises from about 85 to 99 atomic percent of cesium iodide, from about 1 to 15 percent of said other alkali-halide and from about 0.01 to 5 atomic percent of thiocyanate ion.

17. The composition of matter as specified in claim 15 wherein said crystal comprises about 89 atomic percent cesium iodide, about 9 atomic percent of said other alkali-halide and about 2 atomic percent of thiocyanate ion.

18. The composition of matter as specified in claim 15 wherein said other alkali-halide is selected from the group consisting of rubidium iodide, potassium iodide and rubidium bromide.

19. A narrow-band filter for absorbing radiation at a wavelength in the range of 10.5 to 10.8 microns and for transmitting radiation in a surrounding 8 to 12 micron band having a high transmission ratio, comprising an alkali-halide crystal having optical incidence and transmission surfaces and thiocyanate ion present as an impurity in the range of about 0.01 to 5 atomic percent.

20. The narrow-band filter as specified in claim 19 wherein radiation is absorbed at a wavelength of 10.59 microns.

21. The narrow-band filter as specified in claim 19 wherein radiation is absorbed at a wavelength of 10.55 microns.

22. The narrow-band filter as specified in claim 19 wherein radiation is absorbed at a wavelength of 10.68 microns.

23. The narrow-band filter as specified in claim 19 wherein said alkali-halide crystal comprises rubidium iodide.

24. The narrow-band filter as specified in claim 19 wherein said alkali-halide crystal comprises potassium iodide.

25. The narrow-band filter as specified in claim 19 wherein said alkali-halide crystal comprises cesium iodide.

26. The narrow-band filter as specified in claim 19 wherein said alkali-halide comprises about 99 atomic percent of rubidium iodide and said impurity is about 1 atomic percent of thiocyanate ion.

27. The narrow-band filter as specified in claim 19 wherein said alkali-halide comprises about 98 atomic percent of rubidium iodide and said impurity is about 1 atomic percent of thiocyanate ion.

28. The narrow-band filter as specified in claim 19 wherein said alkali-halide comprises about 99 atomic percent potassium iodide and said impurity is about 1 atomic percent of thiocyanate ion.

29. The narrow-band filter as specified in claim 19 wherein said alkali-halide comprises about 99 atomic percent cesium iodide and said impurity is about 1 atomic percent of thiocyanate ion.

30. A narrow-band filter for absorbing radiation at a wavelength in the range of 10.5 to 10.8 microns and for transmitting radiation in a surrounding 8 to 12 micron band having a high transmission ratio comprising a mixed alkali-halide crystal comprising rubidium iodide and another alkali-halide and thiocyanate as an impurity.

31. The narrow-band filter as specified in claim 30 wherein said alkali-halide crystal comprises from about 85 to 99 atomic percent rubidium iodide and from about 1 to 15 atomic percent of said other alkali-halide and said impurity comprises from about 0.01 to 5 atomic percent of thiocyanate ion.

32. The narrow-band filter as specified in claim 30 wherein said alkali-halide crystal comprises about 89 atomic percent rubidium iodide and about 9 atomic percent of said other alkali-halide and said impurity comprises about 2 atomic percent of thiocyanate ion.

33. The narrow-band filter as specified in claim 30 wherein said other alkali-halide is selected from the group consisting of cesium iodide, potassium iodide and rubidium bromide.

34. A narrow-band filter for absorbing radiation at a wavelength in the range of 10.5 to 10.8 microns and for transmitting radiation in a surrounding 8 to 12 micron band having a high transmission ratio comprising a mixed alkali-halide crystal comprising cesium iodide and another alkali-halide and thiocyanate as an impurity.

35. The narrow-band filter as specified in claim 34 wherein said alkali-halide crystal comprises from about 85 to 99 atomic percent cesium iodide and from about 1 to 15 atomic percent of said other alkali-halide and said impurity comprises from about 0.01 to 5 atomic percent of thiocyanate ion.

36. The narrow-band filter as specified in claim 34 wherein said alkali-halide crystal comprises from about 89 atomic percent cesium iodide, about 9 atomic percent of said other alkali-halide and said impurity comprises about 2 atomic percent of thiocyanate ion.

37. The narrow-band filter as specified in claim 34 wherein said other alkali-halide is selected from the group consisting of potassium iodide, rubidium iodide and rubidium bromide.

38. A narrow-band filter for absorbing radiation at a wavelength in the range of 10.5 to 10.8 microns and for transmitting radiation in a surrounding 8 to 12 micron band having a high transmission ratio comprising a mixed alkali-halide crystal comprising potassium iodide and another alkali-halide and thiocyanate as an impurity.

39. The narrow-band filter as specified in claim 38 wherein said alkali-halide crystal comprises from about 85 to 99 atomic percent potassium iodide and from about 1 to 15 atomic percent of said other alkali-halide and said impurity comprises from about 0.01 to 5 atomic percent of thiocyanate ion.

40. The narrow-band filter as specified in claim 38 wherein said alkali-halide crystal comprises about 89 atomic percent potassium iodide and about 9 atomic percent of said other alkali-halide and said impurity comprises about 2 atomic percent of thiocyanate ion.

41. The narrow-band filter as specified in claim 38 wherein said other alkali-halide is selected from a group consisting of cesium iodide, rubidium iodide and rubidium bromide.

42. A composition of matter comprising potassium iodide crystal having an impurity from about 0.01 to 5 atomic percent borofluoride ion.

43. A composition of matter as specified in claim 42 wherein said crystal comprises about 99.5 atomic percent potassium iodide and about 0.5 atomic percent of borofluoride ion.

44. A narrow-band filter for absorbing radiation at a wavelength of 9.28 microns and for transmitting radiation in a surrounding 8 to 12 micron band having a high transmission ratio, comprising potassium iodide crystal having optical incidence and transmission surfaces and borofluoride ion present as an impurity in the range of about 0.01 to 5 atomic percent.

45. The narrow-band filter as specified in claim 44 wherein said crystal comprises 99.5 atomic percent potassium iodide and said impurity is about 0.5 atomic percent borofluoride.

* * * * *